(12) United States Patent
Carney et al.

(10) Patent No.: US 7,298,034 B2
(45) Date of Patent: Nov. 20, 2007

(54) MULTI-CHIP SEMICONDUCTOR CONNECTOR ASSEMBLIES

(75) Inventors: Francis J. Carney, Gilbert, AZ (US); Phillip Celaya, Gilbert, AZ (US); Joseph K. Fauty, Mesa, AZ (US); James P. Letterman, Mesa, AZ (US); Stephen St. Germain, Scottsdale, AZ (US); Jay A. Yoder, Phoenix, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 276 days.

(21) Appl. No.: 10/877,325

(22) Filed: Jun. 28, 2004

(65) Prior Publication Data

US 2005/0285249 A1 Dec. 29, 2005

(51) Int. Cl.
*H01L 23/02* (2006.01)
(52) U.S. Cl. .............................. 257/686; 257/E25.018; 257/676; 257/685; 257/777; 438/108; 438/109; 361/760
(58) Field of Classification Search ........ 257/E23.052, 257/670, 676, 685, 686, 668, 777, E25.018, 257/E23.035, E23.041, E23.042; 438/108, 438/109; 361/760
See application file for complete search history.

(56) References Cited

U.S. PATENT DOCUMENTS

| 5,530,292 | A | * | 6/1996 | Waki et al. ................. 257/724 |
| 5,532,512 | A | * | 7/1996 | Fillion et al. ............... 257/686 |
| 6,265,760 | B1 | * | 7/2001 | Inaba et al. ................. 257/666 |
| 6,423,102 | B1 | * | 7/2002 | Fukunaga et al. ......... 29/25.01 |
| 6,433,422 | B1 | * | 8/2002 | Yamasaki ................... 257/725 |
| 6,458,617 | B1 | * | 10/2002 | Liao et al. .................... 438/51 |
| 6,548,911 | B2 | * | 4/2003 | Yu et al. ...................... 257/786 |
| 6,650,019 | B2 |   | 11/2003 | Glenn et al. |
| 6,713,317 | B2 |   | 3/2004 | Knapp et al. |
| 6,906,424 | B2 | * | 6/2005 | Kinsman .................... 257/777 |
| 7,008,824 | B2 | * | 3/2006 | Akram ........................ 438/123 |
| 2002/0066950 | A1 | * | 6/2002 | Joshi ........................... 257/685 |
| 2004/0061221 | A1 |   | 4/2004 | Schaffer |
| 2005/0224945 | A1 | * | 10/2005 | Saito et al. ................. 257/686 |

* cited by examiner

*Primary Examiner*—Kenneth Parker
*Assistant Examiner*—Chris C. Chu
(74) *Attorney, Agent, or Firm*—Robert F. Hightower

(57) ABSTRACT

In one exemplary embodiment, a multi-chip semiconductor connector is utilized for forming a semiconductor package having a plurality of semiconductor die. The multi-chip semiconductor connector is utilized to mechanically attach the plurality of semiconductor die together and to provide electrical connection to the plurality of semiconductor die.

6 Claims, 12 Drawing Sheets

MULTI-CHIP SEMICONDUCTOR CONNECTOR ASSEMBLIES

CROSS-REFERENCE TO RELATED APPLICATIONS

This application is related to an application entitled "Multi-Chip Semiconductor Connector and Method" having inventors Carney et al and to an application entitled "Multi-Chip Semiconductor Connector Assembly Method" having inventors Carney et al, both of which are filed concurrently herewith and both of which are hereby incorporated herein by reference.

BACKGROUND OF THE INVENTION

The present invention relates, in general, to electronics, and more particularly, to methods of forming semiconductor devices and packaging therefor.

In the past, the semiconductor industry utilized a variety of package configurations to increase the packing density of semiconductor die in a system. The increased demand for electronic devices increased the demand for smaller, lighter, and yet more functional semiconductor devices and resulted in a demand for semiconductor packages that had increased semiconductor packaging densities with smaller outlines and mounting footprints. In some embodiments, semiconductor die were vertically stack on top of one another with an interposing layer of adhesive to attached to the semiconductor die in order to attach the die together. The die were then attached to a glass-epoxy type printed circuit board substrate or other similar substrate. The semiconductor die were then wire bonded to the substrate to form electrical interconnections between the substrate and the semiconductor die. One example of such a package configuration is disclosed in U.S. Pat. No. 6,650,019 issued to Thomas B. Glenn et al on Nov. 18, 2003.

It often took considerable horizontal space to wire bond to both of the semiconductor die which increased the footprint. Further, wire bonding to the semiconductor die consumed additional vertical space which increased the height. Another problem with such a configuration was thermal dissipation. The attachment medium used to attach the two die together often had low thermal conductivity, which reduced the thermal conductivity of the configuration and minimized the power dissipation capability of the configuration.

Accordingly, it is desirable to have a means of attaching multiple die together, that provides high thermal conductivity, that does not require wire bonding, and that has a small footprint.

BRIEF DESCRIPTION OF THE DRAWINGS

For simplicity and clarity of illustration, elements in the figures are not necessarily to scale, and the same reference numbers in different figures denote the same elements. Additionally, descriptions and details of well-known steps and elements are omitted for simplicity of the description.

DETAILED DESCRIPTION OF THE DRAWINGS

Figure 1:
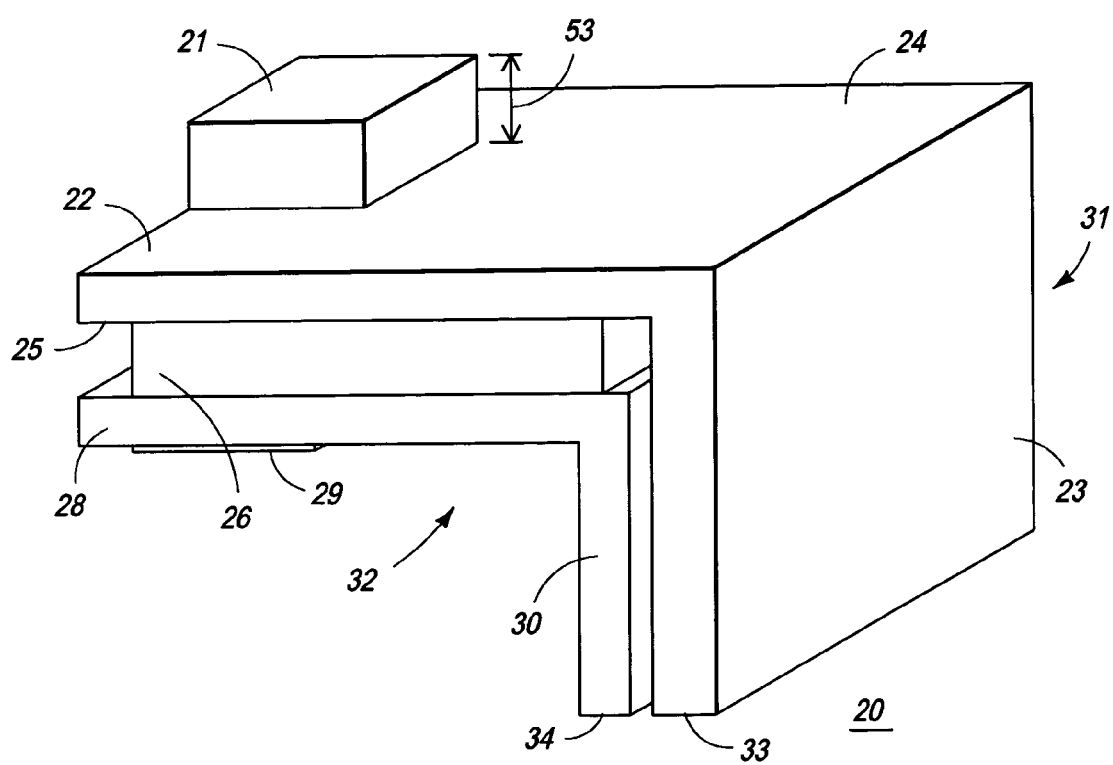
FIG. 1 schematically illustrates a highly enlarged isometric view of a portion of an embodiment of a multi-chip semiconductor connector in accordance with the present invention.

FIG. 1 schematically illustrates a highly enlarged portion of an embodiment of a multi-chip semiconductor connector 20 that may be utilized to attach together a plurality of semiconductor die. Connector 20 includes a first conductive strip 31 that includes a connection portion 22, a support portion 23, and a semiconductor die attachment area or attachment area 21. A second conductive strip 32 of connector 20 has a support portion 30, a connection portion 28, and a semiconductor die attachment area or attachment area 29. Strips 31 and 32 are identified in a general manner by arrows. An insulator 26 is positioned between first conductive strip 31 and second conductive strip 32 to provide electrical isolation therebetween and mechanical support therefor.

Figure 2:
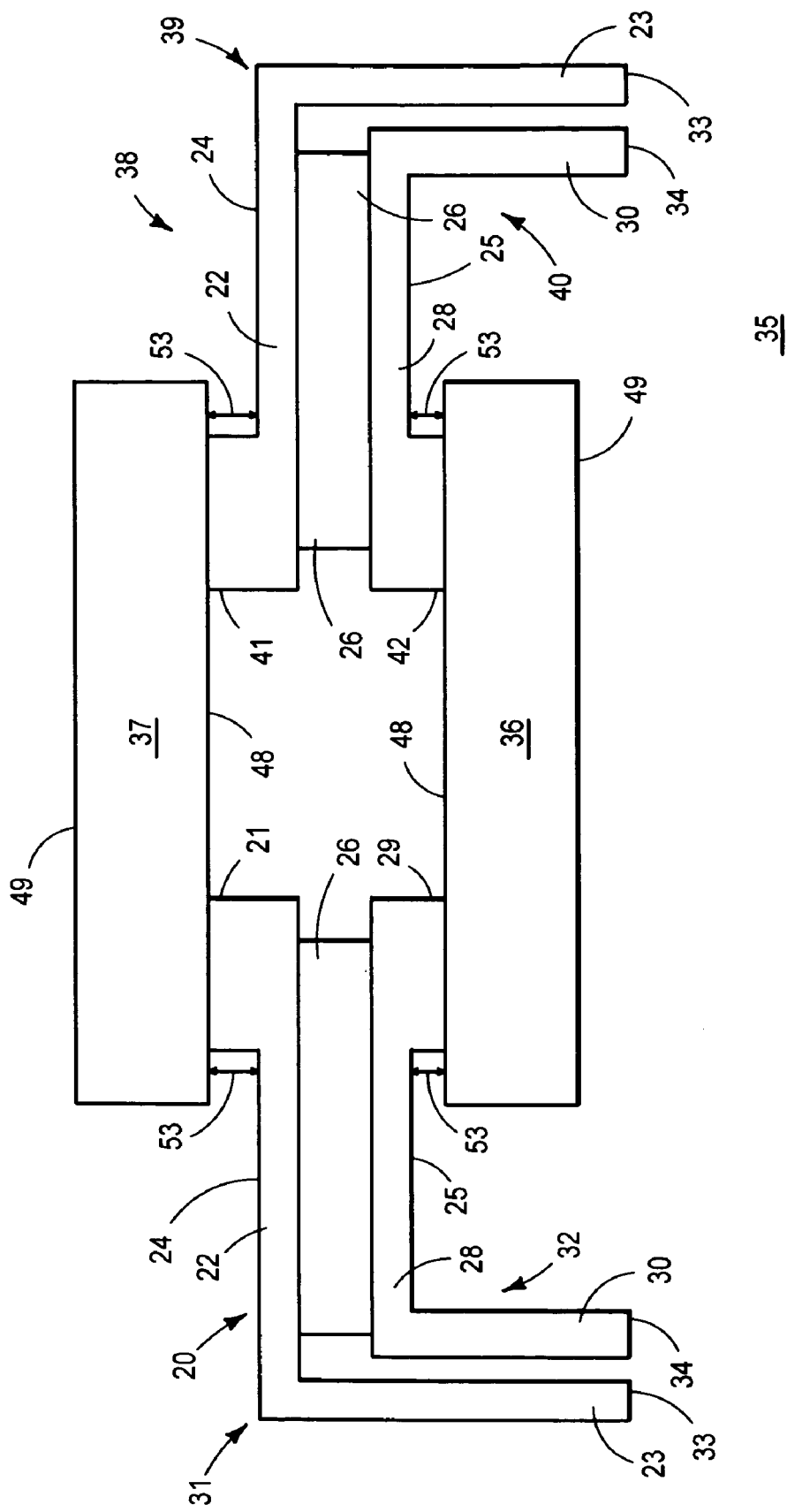
FIG. 2 schematically illustrates an enlarged cross-sectional portion of an embodiment of a multi-chip semiconductor connector assembly that utilizes the multi-chip semiconductor connector from FIG. 1 in accordance with the present invention.

FIG. 2 schematically illustrates an enlarged cross-sectional portion of an embodiment of a multi-chip semiconductor connector assembly 35 that utilizes connector 20 from FIG. 1 as one connector of a plurality of multi-chip semiconductor connectors to attach a first semiconductor die 36 to a second semiconductor die 37. This description has references to both FIG. 1 and FIG. 2. Assembly 35 also includes a second multi-chip semiconductor connector 38 that is an alternate embodiment of connector 20 that was explained in the description of FIG. 1. Connector 38 includes a first conductive strip 39 that has support portion 23, connection portion 22, and a first attachment area 41. A second conductive strip 40 of connector 38 has support portion 30, connection portion 28, and a second attachment area 42. Connector 38 and strips 39 and 40 are identified in a general way by arrows. Methods for forming connectors 20 and 38 are disclosed in a related patent application entitled "Multi-Chip Semiconductor Connector and Method" having inventors Carney et al which previously was incorporated herein by reference.

Semiconductor die 36 and 37 typically have a top side or front side 48 that has a plurality of connection points and a bottom or backside 49 that typically has a single connection point. Such backside and front side connection points and electrodes and methods of forming them are well known to those skilled in the art. For example, die 36 and 37 may be power transistors that have a source and gate connection point on front side 48 and a drain connection point on backside 49. One or both of die 36 and 37 may also be a diode, an IGBT, an analog or a digital logic semiconductor device, or any other type of semiconductor device. The different connection points on each of die 36 and 37 may have different sized attachment pads or connection points, thus, the attachment area of connectors 20 and 38 may have different sizes or surface areas in order to mate to the corresponding connection points on die 36 and 37. For example, a source pad or source connection point may have a larger surface area than a gate pad or gate connection point in order to support a larger current flow, and a drain pad or drain connection point may have an even larger area than the source connection point. Consequently, attachment areas 41 and 42 of connector 38 are formed to have a larger surface area than attachment areas 21 and 29 in order to mate to the respective connection points of die 36 and 37.

In order to form electrical connection to the connection points of die 36 and 37, strips 31, 32, 39, and 40 typically are formed from a conductive material that is suitable for being attached to the connection pads of die 36 and 37, such as solder or conductive epoxy, and that provides a low resistance electrical conduction path. Additionally, connection portions 23, and 30 assist in supporting the weight of assembly 35, thus, the material utilized to form connectors 20 and 38 must also provide rigidity and support. Insulator 26 provides electrical insulation between strips 31 and 32 and between strips 39 and 40 and also provides sufficient rigidity to support at least the weight of die 37. It will be appreciated that strips 31, 32, 39, and 40 may all have different widths and thickness. Although each of strips 31 and 32 are illustrated to have connection portions extending from only one side, it will be appreciated that any of strips 31 and 32 may have connection portions extending from all four sides of support portions 22 and 28, or extending from only one side, or extending from any combination of sides. Attachment areas 21, 29, 41, and 42 typically are formed as raised areas on a portion of the surface of support portions 22 and 28. Areas 21 and 41, and areas 29 and 42 typically extend a first distance 53 from a surface of respective portions 22 and 28, for example extending from surface 24 of portion 22. As will be seen further hereinafter, first distance 53 typically is selected to be at least as large as the bond-line thickness of the attachment material that is utilized to attach areas 21 and 41 to die 37 and areas 29 and 42 to die 36. Additionally, first distance 53 should be sufficient to ensure that the attachment material utilized to attach connectors 20 and 38 to die 36 and 37 sufficiently wets to areas 21, 29, 41, and 42. The surface area of each of attachment areas 21, 29, 41, and 42 generally are formed to be less than the surface area of the exposed part of the corresponding connection point of dies 36 and 37. As is well known in the art, a portion of the connection points on die 36 and 37 may be covered by a passivation layer, thus, the exposed surface area of the connection point may be less than the total surface area of the connection point. In most embodiments, support portions 23 and 30 are formed in a different plane from the plane of connection portions 22 and 28 so that portions 23 and 30 may function as leads that provide external connections to die 36 and 37. A distal end 33 of strips 31 and 39 and a distal end 34 of strips 32 and 40 generally are used to attach assembly 35 to an intermediate substrate such as a printed circuit board or a ceramic substrate or onto a semiconductor leadframe, or may be used as an assembly that is encapsulated to form a semiconductor package. Connectors 20 and 38 are mechanically attached to and electrically connected to die 36 and 37 so that die 36 and 37 generally are in different planes. As can be seen, at least the surface of front side 48 of die 37 is in a different plane from the surface of backside 49 of die 36. Typically, the two planes do not intersect. In most embodiments, the two planes are approximately parallel.

Figure 3:
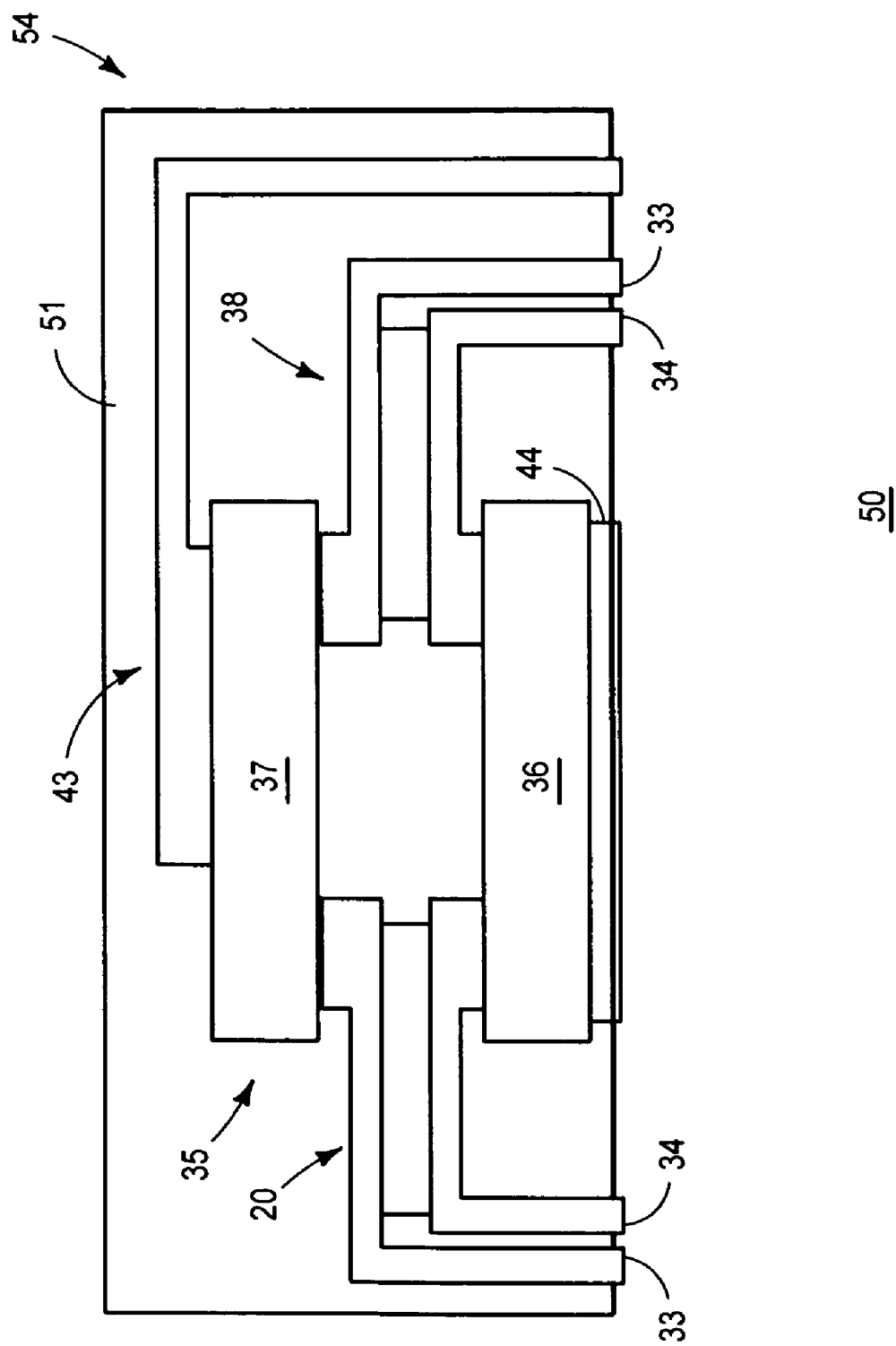
FIG. 3 schematically illustrates an enlarged cross-sectional portion of an embodiment of a semiconductor device that utilizes the multi-chip semiconductor connector assembly from FIG. 2 in accordance with the present invention.

FIG. 3 schematically illustrates an enlarged cross-sectional portion of an embodiment of a semiconductor device 50 that utilizes assembly 35 within a semiconductor package 54 having a package body 51. Package 54 is illustrated in a general way by an arrow. Backside 49 of die 36 typically is attached to a conductor in order to form electrical contact to backside 49. The conductor usually is a die attach area or flag 44 of a semiconductor package leadframe. Additionally, a conductor 43 may be attached backside 49 of die 37 to provide electrical connection thereto. Conductor 43 typically is similar to one of strips 32 or 40.

Distal ends 33 and 34, flag 44, and the distal end of conductor 43 generally are at least substantially coplanar with a bottom surface of body 51. In some embodiments, ends 33 and 34 may extend past the bottom surface of body 51. The mechanical attachment of connectors 20 and 38 to die 36 and 37 facilitates reducing the height or thickness of package 54.

In one example embodiment of assembly 35 and package 54, die 36 and 37 are power transistors. In this embodiment, attachment area 21 is attached to a gate electrode of die 37, attachment area 29 is attached to a gate electrode of die 36, attachment area 41 is attached to a source electrode of die 37, attachment area 42 is attached to a source electrode of die 36, flag 44 is attached to a drain electrode of die 36, and conductor 43 is attached to a drain electrode of die 36.

The rigidly of strips 31, 32, 39, and 40 mechanically support die 36 and 37 and eliminates the need for an insulating material attached to die 36 and 37 and between die 36 and 37 to provide the mechanical support. The large surface area of strips 31, 32, 39, and 40 provides low resistance and high thermal conductivity thereby increasing the thermal capacity of package 54 and reducing the lead resistance.

Figure 4:
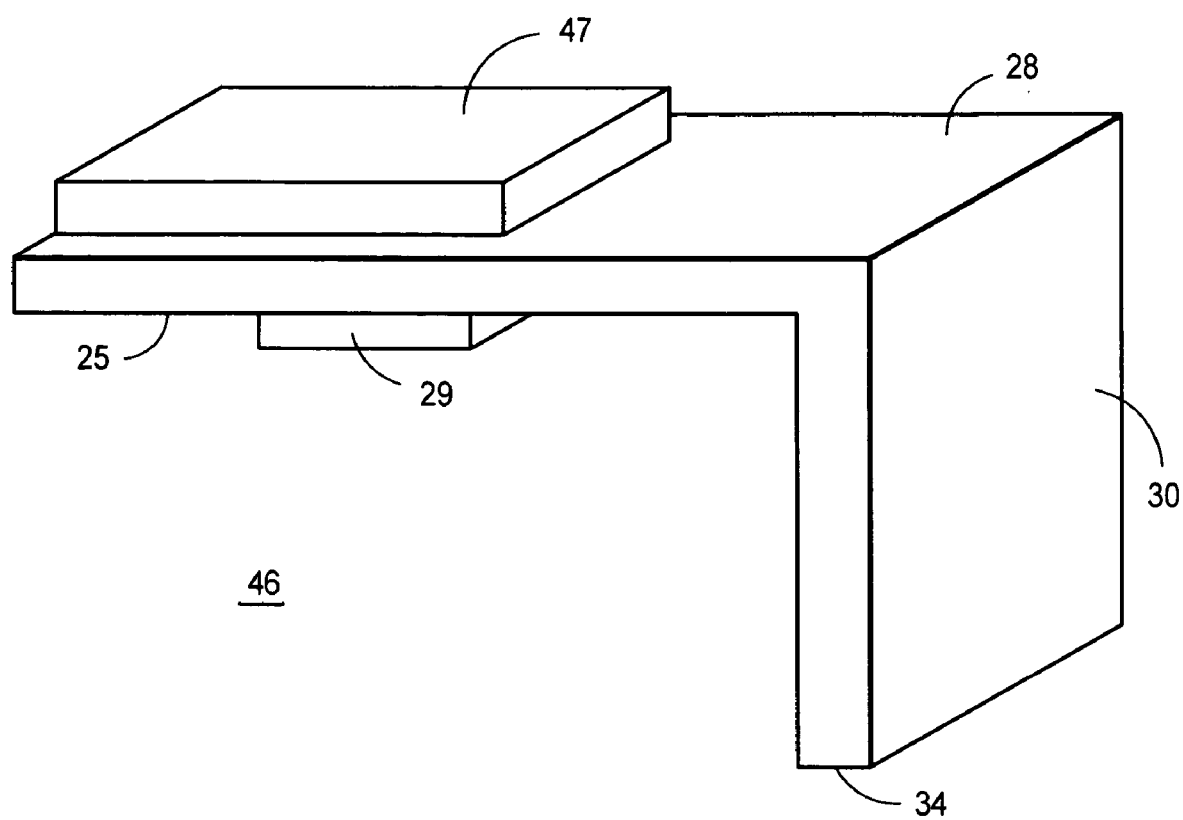
FIG. 4 schematically illustrates an enlarged isometric view of a multi-chip semiconductor connector that is an alternate embodiment of the multi-chip connector of FIG. 1 in accordance with the present invention.

FIG. 4 schematically illustrates an enlarged cross-sectional portion of a multi-chip semiconductor connector 46 that is an alternate embodiment of connectors 20 and 38 that were explained in the description of FIG. 1 through FIG. 3. Connector 46 is utilized to form a mechanical attachment to and a common electrical connection between two semiconductor die such as die 36 and die 37, instead of electrically isolated connections that were formed by connectors 20 and 38. Connector 46 includes a first attachment area 47 on a top surface of portion 28 and second attachment area 29 on bottom surface 25 of portion 22. The surface area of attachment area 47 is larger than the surface area of attachment area 29 in order to provide a low resistance connection between semiconductor die connection points that have different sizes. Alternately, areas 47 and 29 may have the same size in order to provide electrical connection between two connection points of the same size, for example two source connection points.

Figure 5:
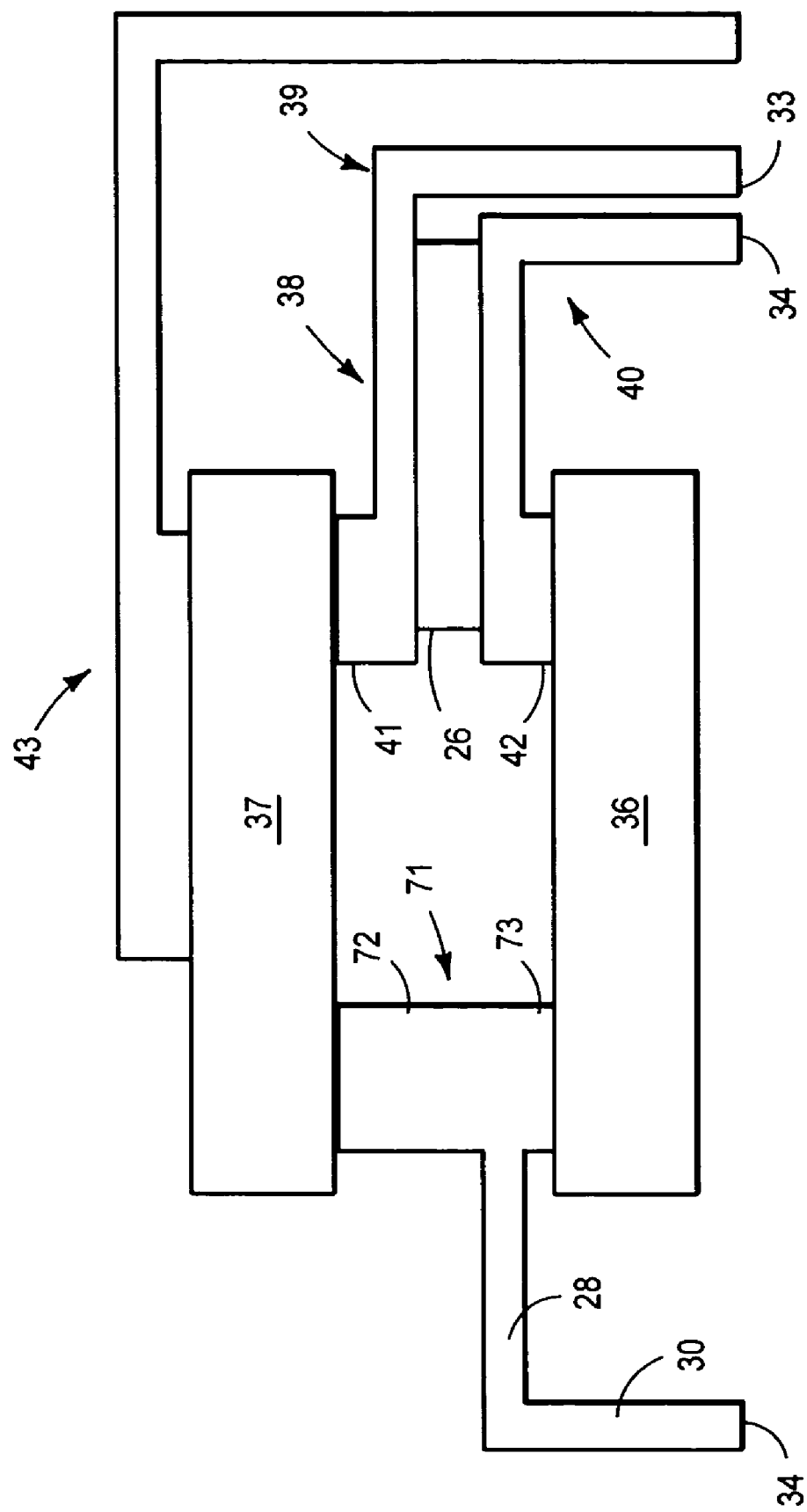
FIG. 5 schematically illustrates an enlarged cross-sectional portion of another multi-chip semiconductor connector assembly that is an alternate embodiment of the multi-chip semiconductor connector assembly of FIG. 2 and FIG. 3 in accordance with the present invention.

FIG. 5 schematically illustrates an enlarged cross-sectional portion of a multi-chip semiconductor connector assembly 70 that is an alternate embodiment of assembly 35 that was explained in the description of FIG. 2 and FIG. 3. Assembly 70 includes a multi-chip semiconductor connector 71 that is an alternate embodiment of connector 46 explained in the description of FIG. 4. Connector 71 is identified in a generally way by an arrow. Connector 71 is one connector of a plurality of multi-chip semiconductor connectors that are electrically to and mechanically attached to first semiconductor die 36 and second semiconductor die 37. Connector 71 provides common electrical connection between connection points of die 36 and 37 in addition to forming a mechanical attachment between die 36 and 37. Connector 71 has an attachment area 72 that is an alternate embodiment of area 47, and an attachment area 73 that is an alternate embodiment of area 29.

In one embodiment of assembly 70, die 36 and 37 are transistor die. Attachment area 41 of connector 38 is attached to a source connection point of die 37 and attachment area 29 is attached to a source connection point of die 36. Connector 71 is utilized to form a common electrical connection between gate connection points on die 36 and die 37. Attachment area 73 has a surface area that is suitable for connecting to the gate connection point of die 36 and attachment area 72 has a surface area that is suitable for connecting to the gate connection point of die 37. The height of attachment areas 72 and 73 and the thickness of portion 22 are selected to ensure that connector 71 is substantially as high as connector 38 in order to keep the planes in which die 36 and 37 are positioned substantially coplanar.

Figure 6:
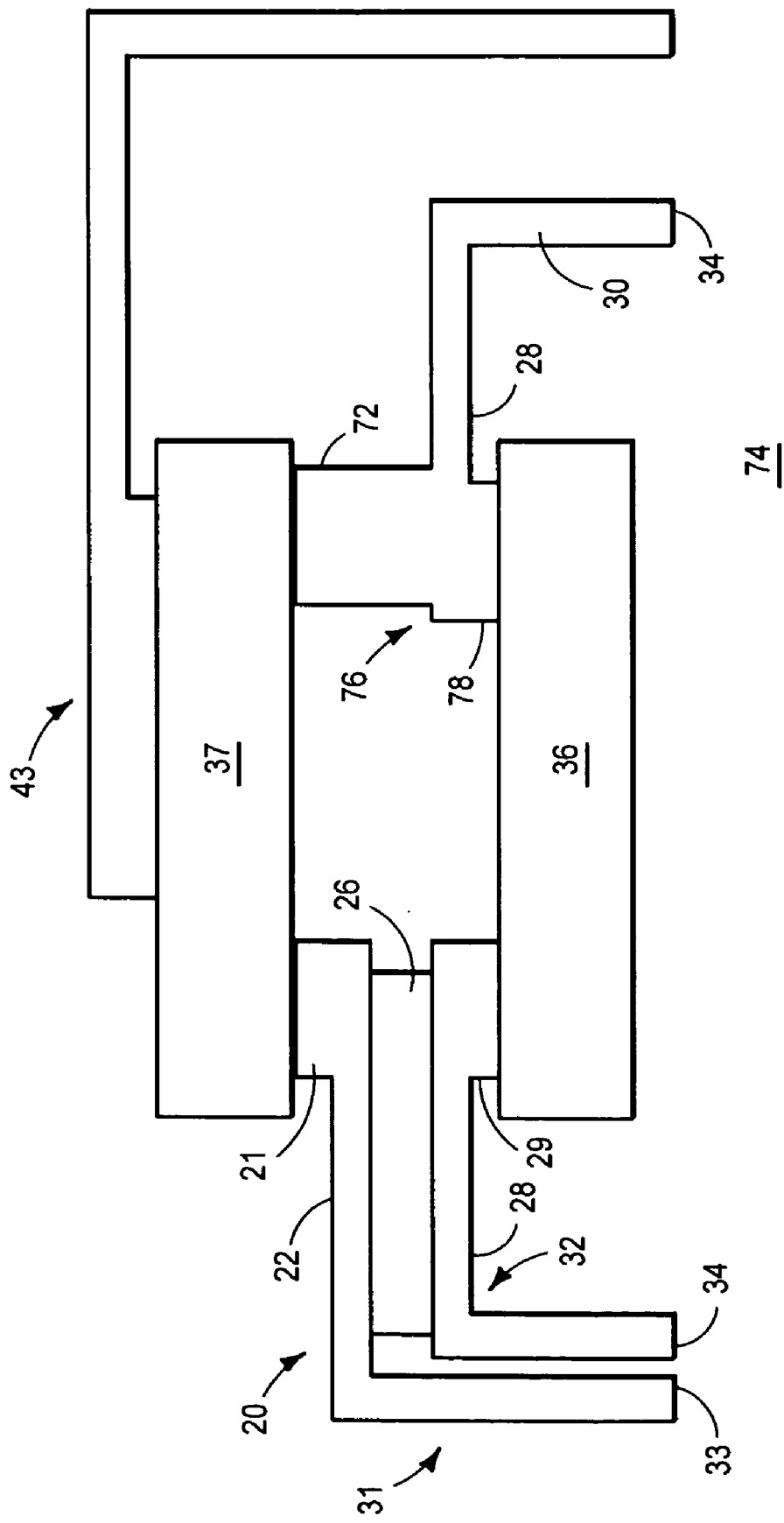
FIG. 6 schematically illustrates an enlarged cross-sectional portion of another multi-chip semiconductor connector assembly is an alternate embodiment of the multi-chip semiconductor connector assembly of FIG. 5 in accordance with the present invention.

FIG. 6 schematically illustrates an enlarged cross-sectional portion of a multi-chip semiconductor connector assembly 74 that is an alternate embodiment of assembly 70 that was explained in the description of FIG. 5. Assembly 74 includes a multi-chip semiconductor connector 76 as one connector of a plurality of multi-chip semiconductor connectors used to mechanically attach die 36 to die 37. Connector 76 is an alternate embodiment of connector 71 that was explained in the description of FIG. 5. Connector 76 provides common electrical connection between connection points of 36 and 37 in addition to forming a mechanical attachment between die 36 and 37. Connector 76 includes an attachment area 72 that is an alternate embodiment of area 47 of connector 46, and an attachment area 78 that is an alternate embodiment of area 29 of connector 46. In some embodiments, areas 72 and 78 are not necessarily coaxial as but may have different loci as illustrated in FIG. 6.

In one embodiment of assembly 74, die 36 and 37 are transistor die. Attachment area 21 of connector 20 is attached to the gate connection point of die 37 and attachment area 29 is attached to the gate connection point of die 36. Connector 76 is utilized to form a common electrical connection between the source connection points on die 36 and die 37. Attachment area 78 has a surface area that is suitable for connecting to the source connection point of die 36 and attachment area 72 has a surface area that is suitable for connecting to the source connection point of die 37. The height of attachment areas 72 and 78 and the thickness of portion 22 typically are selected to ensure that connector 76 is substantially as high as connector 20 in order to keep the planes in which die 36 and 37 are positioned substantially coplanar.

Figure 7:
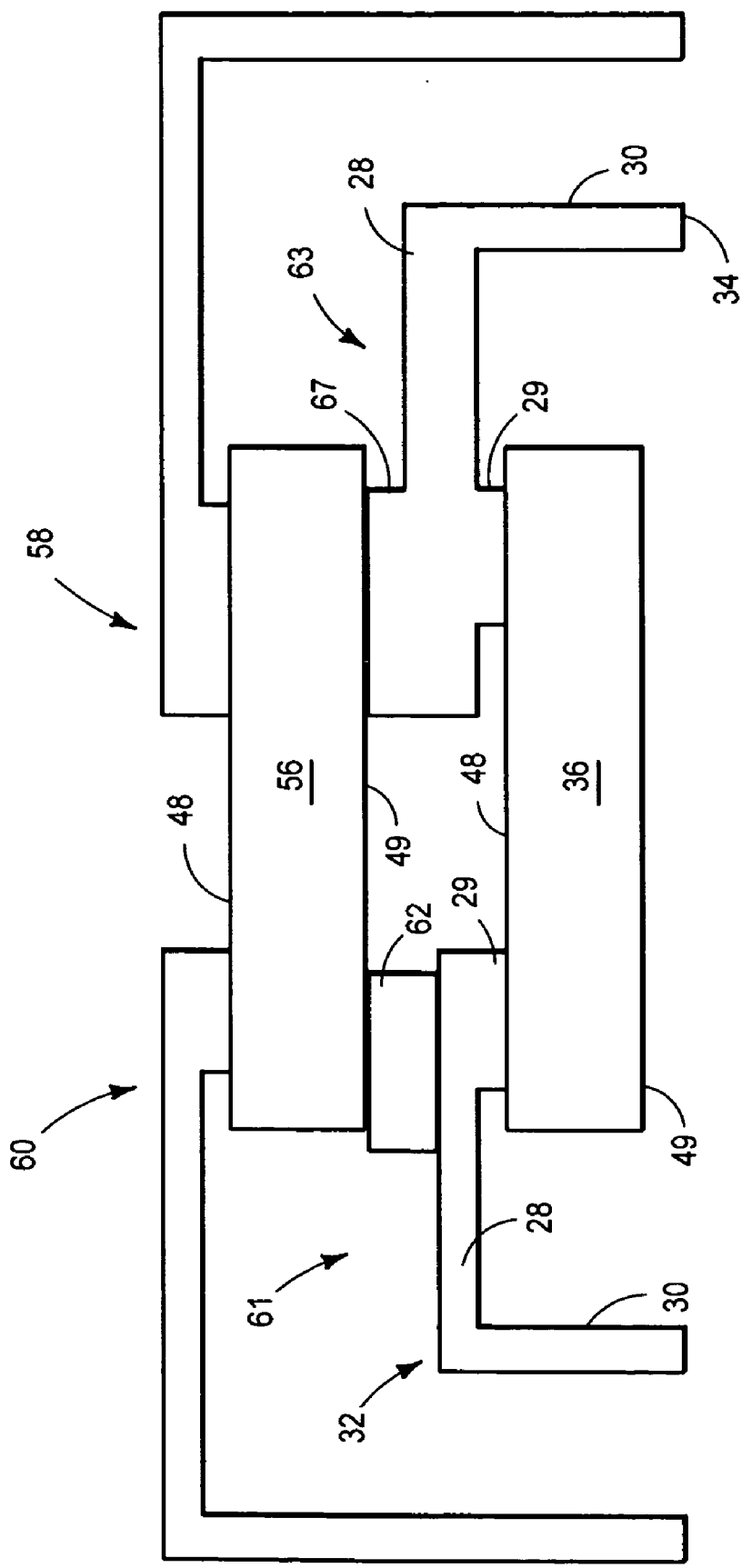
FIG. 7 schematically illustrates an enlarged cross-sectional portion of another multi-chip semiconductor connector assembly that is an alternate embodiment of the multi-chip semiconductor connector assembly of FIG. 2 and FIG. 3 in accordance with the present invention.

FIG. 7 schematically illustrates an enlarged cross-sectional portion of a multi-chip semiconductor connector assembly 55 that is an alternate embodiment of assembly 35 that was explained in the description of FIG. 2 and FIG. 3, and an alternate embodiment of assemblies 70 and 74 that were explained in the description of FIG. 5 and FIG. 6. Assembly 55 includes a semiconductor die 56 that has a different orientation than die 36 and 37. Die 56 is oriented with backside 49 facing the same direction as backside 49 of die 36. For example, die 56 may have a high current carrying electrode, such as a drain of an MOS transistor, on backside 49, and a plurality of other electrodes on front side 48.

Assembly 55 also includes a multi-chip semiconductor connector 61 and a multi-chip semiconductor connector 63 that are utilized to mechanically attach die 56 to die 36. Connector 63 is an alternate embodiment of connector 46 (See FIG. 4) and includes an attachment area 67 that is an alternate embodiment of area 47. Connector 63 is formed to provide a common electrical connection between die 36 and 56 and to mechanically attach die 56 to die 36. Connector 63 is also formed to provide electrical contact to a large surface area contact point, thus, the surface area of attachment area 67 is larger than attachment area 29. Connector 63 provides a common connection between the connection point on backside 49 of die 56 and a connection point on the front side of die 36. Connector 61 is an alternate embodiment of connector 20. Connector 61 includes second conductive strip 32 of connector 20 (See FIG. 2) and an insulator 62 on a surface of connection portion 28. Insulator 62 is similar to insulator 26, however, the thickness of insulator 62 is selected to assist in forming the height of connector 61 similar to the height of connector 63 so that the plane in which die 56 is positioned is substantially coplanar to the plane in which die 36 is positioned. Both the thickness of strip 32 and the thickness of insulator 62 may be varied to obtained the desired thickness. Assembly 55 may also include conductors 58 and 60 that are electrically connected to electrodes on front side 48 of die 56. Conductors 58 and 60 are alternate embodiment of conductor 43 of FIG. 3.

In one exemplary embodiment of assembly 55, die 36 and 56 are transistors. In this embodiment, attachment area 67 is attached to a drain connection point of die 56, attachment area 29 is attached to the source connection point of die 36, insulator 62 is attached to die 56, and attachment area 29 is attached to the gate connection point of die 36.

Figure 8:
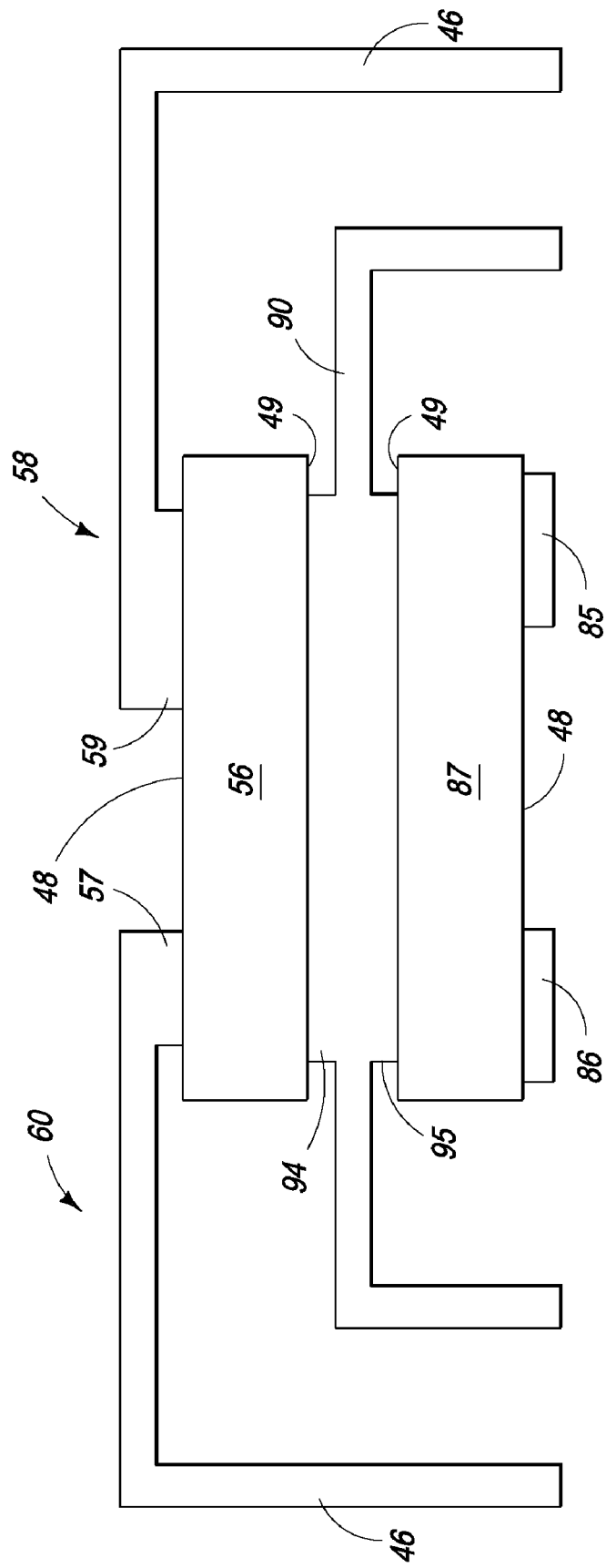
FIG. 8 schematically illustrates an enlarged cross-sectional portion of an embodiment of another multi-chip semiconductor connector assembly that is an alternate embodiment of the multi-chip semiconductor connector assembly of FIG. 7 in accordance with the present invention.

FIG. 8 schematically illustrates an enlarged cross-sectional portion of an embodiment of a multi-chip semiconductor connector assembly 80 that is an alternate embodiment of respective assemblies 35, 70, 74, and 55 explained in the description of FIGS. 2, 5, 6, and 7. Assembly 80 includes a semiconductor die 87 and die 56 that are mechanically attached and electrically connected together by a multi-chip semiconductor connector 90 that is an alternate embodiment of connector 46 explained in the description of FIG. 4. Die 87 is similar to die 36 but is oriented with a connection point on backside 49 facing toward a connection point on backside 49 of die 56. Multi-chip semiconductor connector 90 is utilized to provide a common electrical connection between the backside connection points of die 87 and 56, to provide support for assembly 80, and to provide an external electrical connection to assembly 80. Connector 90 includes attachment areas 94 and 95 that have a surface area that is sufficiently large to attach to a large surface area connection point of backside 49 of die 56 and 87.

In one exemplary embodiment of assembly 80, die 56 and 87 are transistors. In this embodiment, attachment area 94 is attached to a drain electrode connection point of die 56 and attachment area 95 is attached to a drain electrode connection point of die 87. Conductors 85 and 86 are conductions of a semiconductor package leadframe that are connected to respective gate and source connection points of die 87. Such leadframe leads and methods for attaching the connection points thereto are well known in the art.

Figure 9:
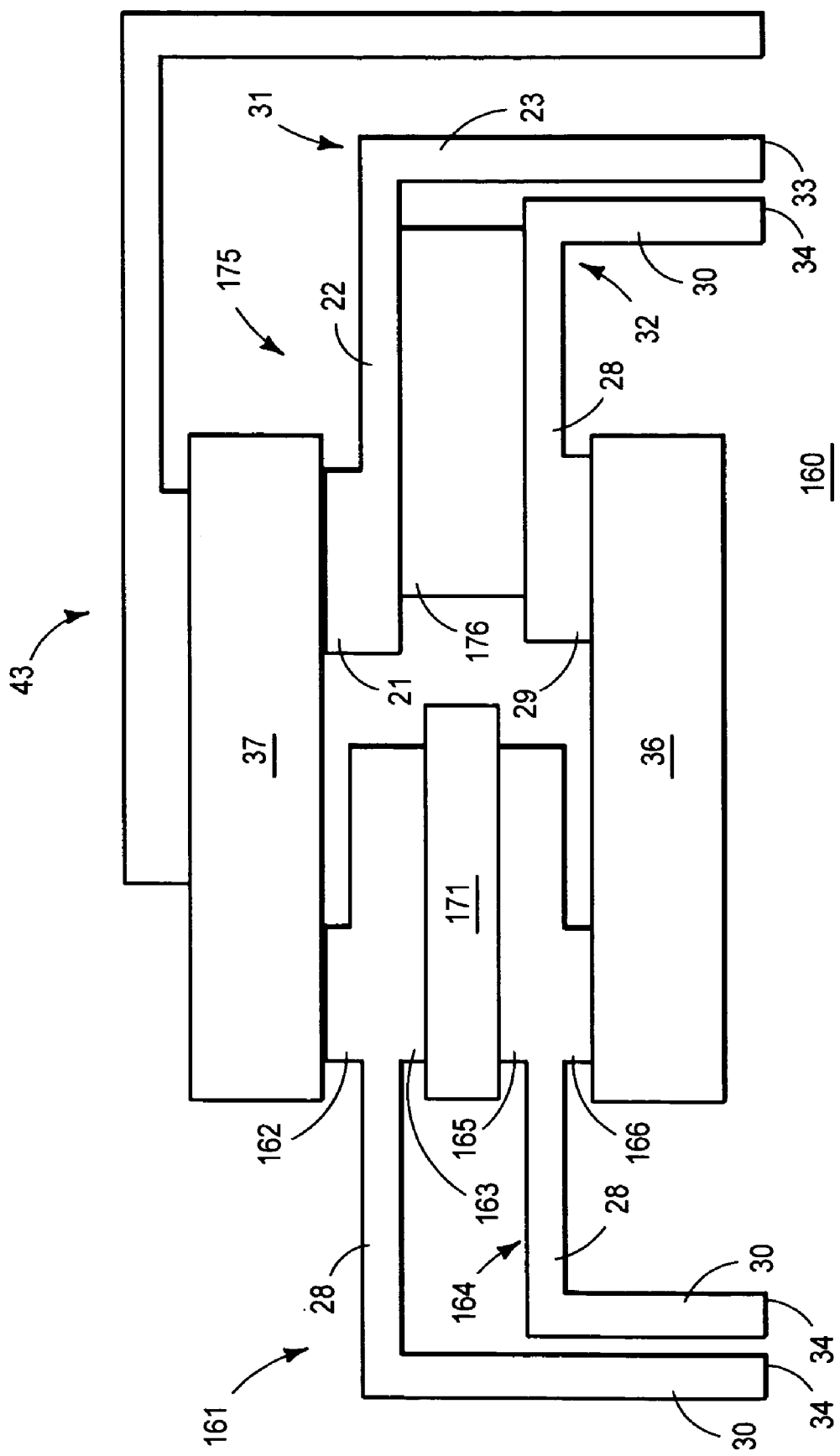
FIG. 9 schematically illustrates an enlarged cross-sectional portion of an embodiment of another multi-chip semiconductor connector assembly that is alternate embodiment of the multi-chip semiconductor connector assembly of FIG. 2 and FIG. 3 in accordance with the present invention.

FIG. 9 schematically illustrates an enlarged cross-sectional portion of a multi-chip semiconductor connector assembly 160 that is an alternate embodiment of assembly 35 that was explained in the description of FIG. 2 and FIG. 3. Assembly 160 includes die 36 and 37, multi-chip semiconductor connectors 161 and 164 that are alternate embodiments of connector 46 (see FIG. 4), and a multi-chip semiconductor connector 175 that is an alternate embodiment of connector 20 (see FIG. 2 and FIG. 3). Connectors 161 and 164 mechanically attach together and electrically connect together a plurality of semiconductor die that are not all in the same plane. The plurality of semiconductor die includes first semiconductor die 36, second semiconductor die 37, and a third semiconductor die 171. Connectors 161, 164, and 175 are identified in a generally way by arrows.

Connector 161 includes attachment areas 162 and 163 that are alternate embodiments of areas 47 and 29. Connector 164 includes attachment areas 165 and 166 that are alternate embodiments of areas 47 and 29. Connector 161 mechanically attaches to and electrically connects one connection point of die 171 to one connection point of die 37. Similarly, connector 164 mechanically attaches to and electrically connects another connection point of die 171 to one connection point of die 36. Connector 175 is an alternate embodiment of connector 20 with insulator 26 of connector 38 replaced by an insulator 176. Insulator 176 usually is formed to have a thickness so that the thickness or height of connector 175 is substantially the same as the thickness or height of connector 161, connector 164, and die 171. Alternately, the thickness of strips 31 or 32, or the thickness of attachment areas 21 or 29 may be adjusted to keep the height or thickness of connector 175 approximately equal to that of connector 161, connector 164, and die 171 to assist in keeping the plane in which die 36 is positioned substantially coplanar to the plane in which die 37 is positioned.

The assembly of connectors 161 and 164 attached to die 171 can also be viewed as an alternate embodiment of connector 20 with insulator 26 replaced by die 171.

In one exemplary embodiment of assembly 160, die 36 and 37 are transistors and die 171 is a semiconductor diode. In this embodiment, attachment area 162 is attached to a source connection point of die 36, attachment area 163 is attached to an anode connection point of die 171, attachment area 165 is attached to a cathode connection point of die 171, and attachment area 166 is attached to a source connection point of die 36. Attachment area 21 of connector 175 is attached to a gate connection point of die 37, and attachment area 29 is attached to a gate electrode connection point of die 36.

Figure 10:
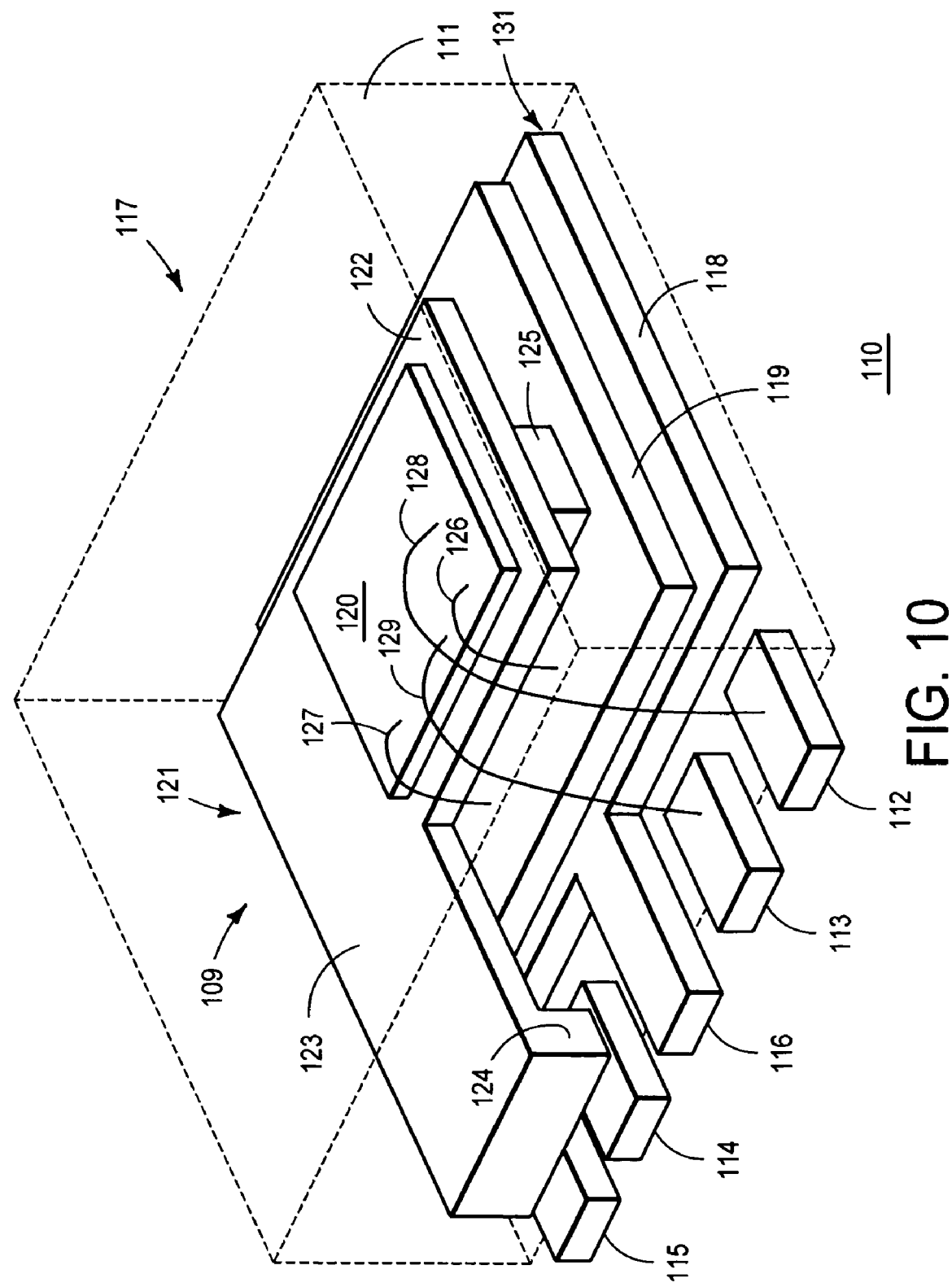
FIG. 10 schematically illustrates an enlarged cross-sectional portion of a semiconductor device that utilizes a multi-chip semiconductor connector assembly in accordance with the present invention.

FIG. 10 schematically illustrates an enlarged cross-sectional portion of a semiconductor device 110 that utilizes a multi-chip semiconductor connector assembly 109 within a semiconductor package 117 that has a package body 111. Assembly 109 and package 117 are identified in a generally way by arrows. Body 111 is shown in phantom for clarity of the drawings. Assembly 109 is an alternate embodiment of at least respective assemblies 35, 70, 74, and 55 explained in the description of FIGS. 2, 5, 6, and 7. Assembly 109 includes a multi-chip semiconductor connector 121 that is an alternate embodiment of connector 46 explained in the description of FIG. 4 and FIG. 8. Assembly 109 also includes a semiconductor die 119, a semiconductor die 120, and a semiconductor package leadframe 131, identified in general by an arrow. Leadframe 131 has a die attach area or flag 118 that is similar to flag 44 and a plurality of leads that includes leads 112 through 116. Lead 116 is electrically and mechanically attached to flag 118 and leads 112-115 are electrically isolated from flag 118.

Connector 121 is formed to include a support portion 124, a connection portion 123, a first attachment area 125, and a second attachment area 122. Attachment area 125 is formed on connection portion 123 similar to attachment area 29. Attachment area 125 is electrically connected to and mechanically attached to a connection point, for example a source connection point, of die 119. Connector 121 is used to electrically and mechanically connect the connection point of die 119 to leads 114 and 115. Semiconductor die 120 is mechanically attached to second attachment area 122 of connection portion 123, thus, connector 121 attaches together two semiconductor die that are not in the same plane. Attachment area 122 may be a raised area similar to attachment area 47 of connector 46, or may be a portion of the surface of connection portion 123.

In a first embodiment of device 110, package 117 is formed in a configuration commonly referred to as a QFN type package, die 119 is a power transistor that is oriented in a manner similar to die 36 (See FIG. 2), and die 120 is an analog power transistor driver device that is suitable for receiving signals and responsively enabling and disabling a power transistor. Such driver devices are well known to those skilled in the art. Front side 48 of die 119 typically has a plurality of connection points, such as a source and a gate, and backside side 49 typically has a single connection point, such as a drain. Backside 49 of die 119 is mechanically and electrically attached to flag 118, thus, to lead 116. Attachment area 125 of connector 121 is mechanically attached to and electrically connected to a source connection point of die 119. Connection portion 123 of connector 121 is formed with a shape similar to an "L" that is lying in a horizontal plane in order to route the electrical connection from the source of die 119 to leads 114 and 115. Support portion 124 is formed in a plane that is different from the plane of connection portion 123 in order to facilitate electrically and mechanically connecting to leads 114 and 115.

Die 120 typically has a plurality of connection points on the front side and only a substrate connection on the backside. In this first embodiment, die 120 is attached to attachment area 122 by an electrically insulating medium such as non-conductive epoxy. Thus, die 120 is electrically isolated from connector 121 and from the electrical connection that connector 121 forms with die 119.

Assembly 109 can be formed by the same techniques used to form assembly 35 and package 50. Die 119 typically is die bonded to flag 118. Thereafter, the attachment medium may be placed on the connection point of die 119 and on leads 114 and 115. Then, connector 121 may be placed onto the medium with area 125 overlying the connection point of die 119 and with portion 124 overlying leads 114 and 115. The attachment medium can then be activated to attach connector 121 to die 119 and leads 114 and 115. For example, if the attachment medium is solder, the solder can be reflowed to complete the activation or if the attachment medium is conductive epoxy, the epoxy can be cured to complete the attachment. Subsequently, a non-conductive epoxy can be used to attach die 120 to area 122. Leads 112 and 113 can be wire bonded to the corresponding connection points of die 119 and 120. For example, connection points on die 120 may be wire-bonded to a current sense connection point and a gate connection point of die 119 by respective bonding wires 126 and 127. Other connection points of die 120 can be wire-bonded to leads 112 and 113 respective bonding wires 128 and 129. Alternately, conductors such as conductor 43 of FIG. 2 can be used to attach the other connection points of die 119 to die 120, and for the connection between die 120 and leads 112 and 113.

In a second embodiment, die 120 may be a power transistor that has a drain connection point on backside 49. A conductor such as conductors 58 and 60 of FIG. 7 may be used to connect the source and gate connection points to leads 112 and 113 instead of wirebonds 126 and 129.

Figure 11:
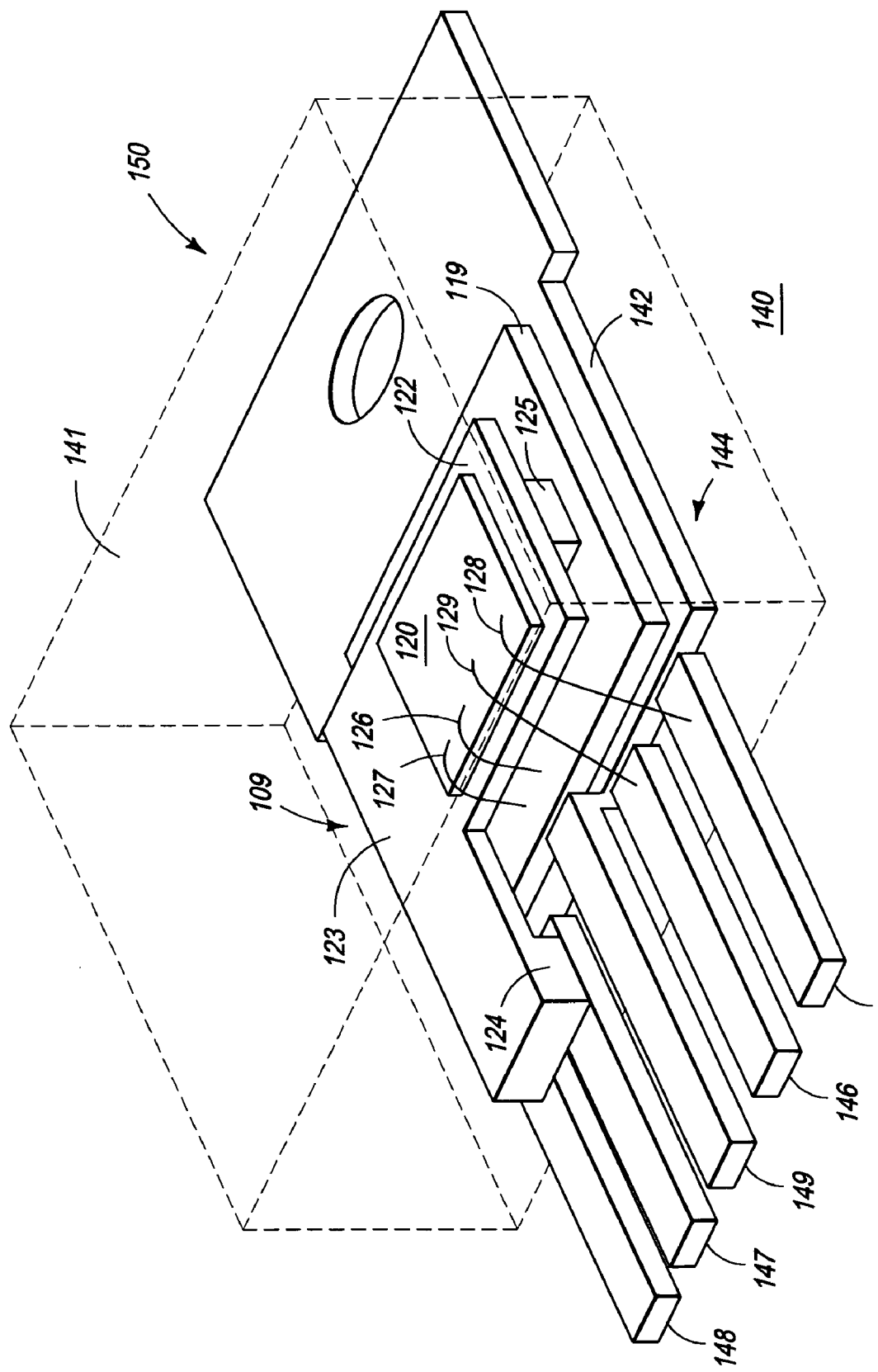
FIG. 11 schematically illustrates an enlarged cross-sectional portion of another semiconductor device that utilizes a multi-chip semiconductor connector assembly in accordance with the present invention.

FIG. 11 schematically illustrates an enlarged cross-sectional portion of a semiconductor device 140 that is an alternate embodiment of device 110 explained in the description of FIG. 10. Device 140 utilizes multi-chip semiconductor connector assembly 109 within a semiconductor package 150 having a package body 141. Package 150 is identified in a general manner by an arrow. Device 140 includes a leadframe 144 that has a die attach area or flag 142 and a plurality of leads that includes leads 145 through 149 that are alternate embodiments of flag 118 and leads 112-116. Lead 149 is electrically and mechanically attached to flag 142 and leads 145 through 148 are isolated from flag 142. The backside of die 119 is mechanically attached and electrically connected to flag 142. Assembly 109 may be formed and also mechanically and electrically attached to leadframe 144 in a manner similar to that explained in the description of FIG. 10. In one embodiment, semiconductor package 150 is formed in a configuration commonly referred to as a TO-220 type package.

Figure 12:
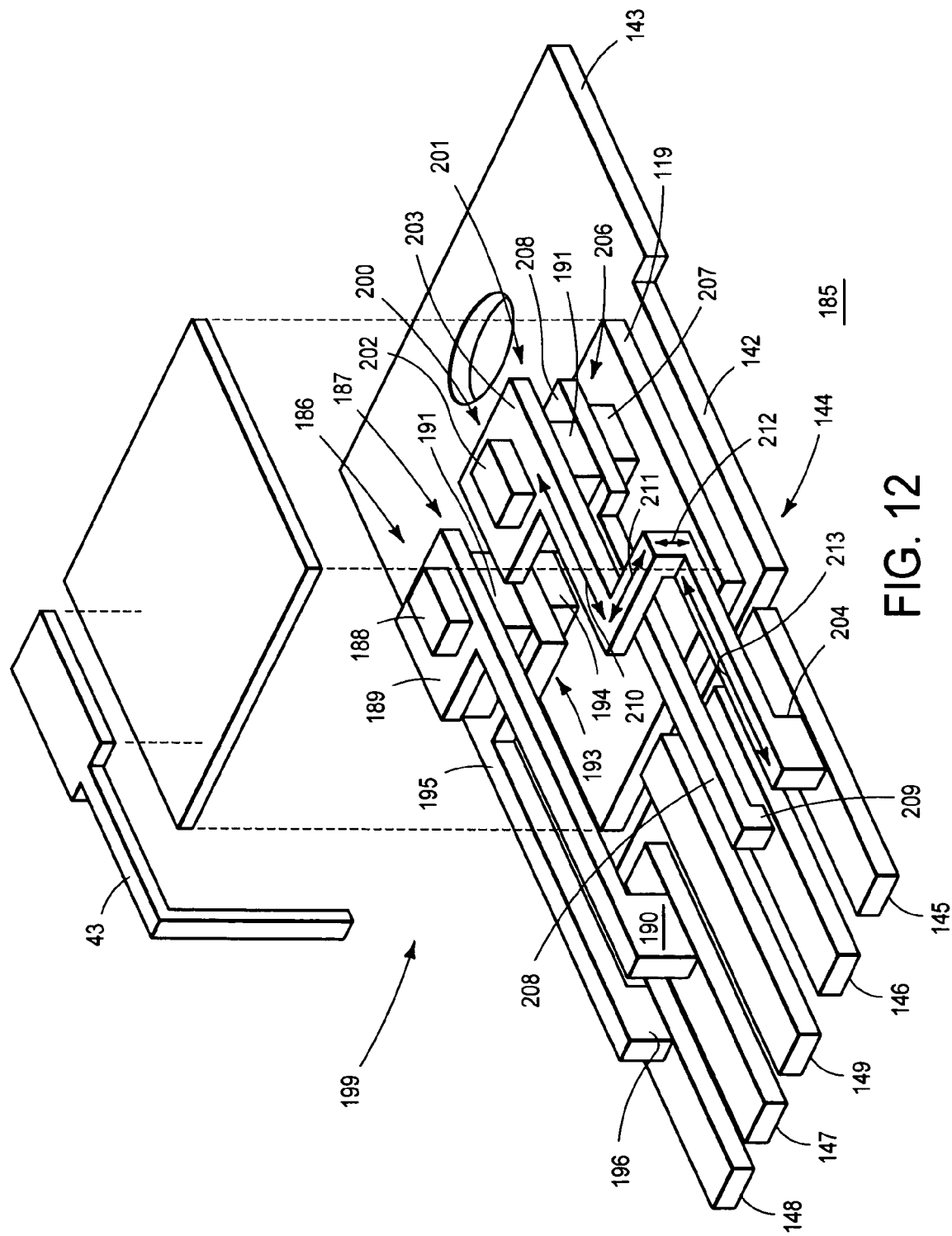
FIG. 12 schematically illustrates an enlarged cross-sectional portion of another semiconductor device that utilizes a multi-chip semiconductor connector assembly in accordance with the present invention.

FIG. 12 schematically illustrates an enlarged partially exploded isometric view of a portion of a semiconductor device 185 that is an alternate embodiment of device 140 explained in the description of FIG. 11. However, the front side of die 120 is positioned to face the front side of die 119 instead of away from the front side of die 120 as illustrated in FIG. 11. Device 185 utilizes a multi-chip semiconductor connector assembly 199 within semiconductor package 150. Package body 141 is omitted in FIG. 12 for clarity of the drawing. Device 185 includes a plurality of multi-chip semiconductor connectors including multi-chip semiconductor connectors 186 and 200 that are alternate embodiments of connectors 20 and 38 (see FIG. 2). Connectors 186 and 200 mechanically attach together a plurality of semiconductor die that are not all in the same plane. Connectors 186 and 200 are electrically connected to and mechanically attached to the plurality of semiconductor die. The plurality of semiconductor die include semiconductor die 119 and 120. Connector 186 includes a first conductive strip 187 and a second conductive strip 193 that are alternate embodiments of respective strips 31 and 32 (FIG. 2). Strip 193 includes a connection portion 196, a support portion 195, and an attachment area 194 that are alternate embodiments of respective portion 30, portion 28, and area 29. Strip 187 includes a connection portion 190, a support portion 189, and an attachment area 188 that are alternate embodiments of resection portion 23, portion 22, and area 21. Similarly, connector 200 includes a first conductive strip 201 and a second conductive strip 206 that are alternate embodiments of strips 31 and 32 (FIG. 2). Strip 206 includes a connection portion 209, a support portion 208, and an attachment area 207 that are alternate embodiments of resection portion 30, portion 28, and area 29. Strip 201 includes a connection portion 204, a support portion 203, and an attachment area 202 that are alternate embodiments of respective portion 23, portion 22, and area 21. Connectors 186 and 200, and strips 187, 193, 201, and 206 are identified in a generally way by arrows. Connectors 186 and 200 also include an insulator 191 that is an alternate embodiment of insulator 26 (FIG. 2). Insulator 191 is sized for the dimensions of connectors 186 and 200. Attachment areas 188 and 202 are electrically connected to and mechanically attached to connections points on die 120. A conductor such as conductor 43 may be attached to the backside of die 120 and to leadframe 144. A distal end of conductor 43 may electrically connected to one of leads 145 through 149.

As can be seen, the connection portions and the support portions of the conductive strips of connectors 186 and 200 may have various shapes in order to route the electrical connections from the connection points of the respective semiconductor die to other points such as to leads of a leadframe, to conductors of a substrate such as a ceramic substrate or a printed circuit board or a flex tape, or to other conductors external to the semiconductor die and external to the multi-chip semiconductor connectors. The various shapes may be within a plane parallel to the attachment areas or may be in other planes. For example, a first portion of the conductive portion of strip 201 extends away from attachment area 202 for a distance 210 and makes a first right angle turn all within a first plane, a second portion of the conductive portion of strip 201 extends a second distance 211 within the first plane away from the first right angle and makes a second right angle turn out of the first plane, a third portion of the conductive portion of strip 201 extends within a second plane a third distance 212 away from the second right angle turn and makes a third right angle turn, a fourth portion of the conductive portion of strip 201 extends within a third plane a fourth distance 213 away from the third right angle until merging into connection portion 204. The turns of conductive portion 203 may be made at angles other than right angles.

In view of all of the above, it is evident that a novel device and method is disclosed. Included, among other features, is forming a multi-chip semiconductor assembly by electrically connecting and mechanically attaching a multi-chip semiconductor connector to a plurality of semiconductor die. The rigidity of the multi-chip semiconductor connector provides support for the die and eliminates the need for an intermediate adhesive support layer thereby improving the thermal dissipation of the assembly and packages that use the assembly. Using the connectors to provide electrical connection between the semiconductor die and a semiconductor package reduces the package height and footprint. Additionally, more than two semiconductor die can be attached together to increase the packing density of the packages and any system that uses the packages.

The invention claimed is:

1. A multi-chip semiconductor connector assembly for a semiconductor package comprising:
   a first conductive strip having a first thickness and also having a first attachment area on a first surface and a second attachment area on a second surface;
   a first semiconductor die having a plurality of connection points on a first surface of the first semiconductor die with a first connection point of the plurality of connection points attached to the first attachment area of the first conductive strip;

a second semiconductor die having a plurality of connection points on a first surface of the second semiconductor die with a first connection point of the plurality of connection points attached to the second attachment area of the first conductive strip;

a second conductive strip having a second thickness that is different from the first thickness and also having a connection point attached to a second surface of the first semiconductor die that is opposite to the first surface of the first semiconductor die wherein a portion of the first semiconductor die overlies a portion of the second semiconductor die and wherein the first attachment area, the second attachment area, and the connection point of the second conductive strip are configured to be encapsulated within a single body of a single semiconductor package.

2. The multi-chip semiconductor connector assembly of claim 1 further including the first semiconductor die in a first plane and the second semiconductor die in a second plane that is different from the first plane.

3. The multi-chip semiconductor connector assembly of claim 1 wherein the first connection point of the first semiconductor die is a drain of a first power MOS transistor and the first connection point of the second semiconductor die is a drain of a second power MOS transistor.

4. A multi-chip semiconductor connector assembly comprising:

a first conductive strip having a first thickness and also having a first attachment area on a first surface and a second attachment area on a second surface;

a first semiconductor die having a connection point on a first surface of the first semiconductor die and mechanically attached directly to the first attachment area of the first conductive strip;

a second semiconductor die having a connection point on a first surface of the second semiconductor die and mechanically attached directly to the second attachment area of the first conductive strip wherein a portion of the first semiconductor die overlies a portion of the second semiconductor die; and a second conductive strip having a second thickness that is different from the first thickness and also having a connection point attached to a second surface of the first semiconductor die that is opposite to the first surface of the first semiconductor die.

5. The assembly of claim 4 wherein the connection point of the first semiconductor die is mechanically attached directly to the first attachment area by an attachment medium that is one of solder, conductive epoxy, or thermocompression.

6. The assembly of claim 4 wherein the connection point of the first and second semiconductor die are both drains of power MOS transistors.

* * * * *